(12) United States Patent
Huh et al.

(10) Patent No.: US 6,759,172 B2
(45) Date of Patent: Jul. 6, 2004

(54) COLOR FILTER FOR A LIQUID CRYSTAL DISPLAY AND A LIQUID CRYSTAL DISPLAY USING THE SAME

(75) Inventors: Chul Huh, Yongin (KR); Byoung-Joo Kim, Anyang (KR); Seung-Ryoung Ji, Cheonan (KR); Woo Choi, Cheonan (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/346,081

(22) Filed: Jan. 17, 2003

(65) Prior Publication Data

US 2003/0218703 A1 Nov. 27, 2003

(30) Foreign Application Priority Data

Jan. 18, 2002 (KR) .................. 10-2002-0002949

(51) Int. Cl.[7] .......................... G02B 5/20; G02F 1/1335
(52) U.S. Cl. .......................... 430/7; 349/106; 349/107; 428/1.32
(58) Field of Search ........................ 430/7; 349/106, 349/107; 428/1.3, 1.31, 1.32

(56) References Cited

FOREIGN PATENT DOCUMENTS

| JP | 2-298901 A | * 12/1990 |
| JP | 9-292513 A | * 11/1997 |
| JP | 11-240938 A | * 9/1999 |

* cited by examiner

*Primary Examiner*—John A. McPherson
(74) *Attorney, Agent, or Firm*—McGuireWoods LLP

(57) ABSTRACT

The present invention relates to a color filter for a liquid crystal display and a liquid crystal display using the same, and more particularly to a color filter for a liquid crystal display comprising a pixel area, a black matrix, and a transparent overcoating film, wherein the transparent overcoating film comprises a thermosetting polymer obtained by mixing a) polyamic acid having siloxane terminal groups; and b) an epoxy compound having 1 to 4 epoxy groups, and a liquid crystal display using the same.

The color filter for a liquid crystal display of the present invention comprises a transparent overcoating film having a wide pattern formation margin of a transparent electrode and superior heat resistance, light resistance, and transmissivity. When applied to a liquid crystal display, this color filter can offer a liquid crystal display, particularly ITO PVA mode liquid crystal display with good physical properties and is capable of realizing a wide view angle.

11 Claims, 5 Drawing Sheets

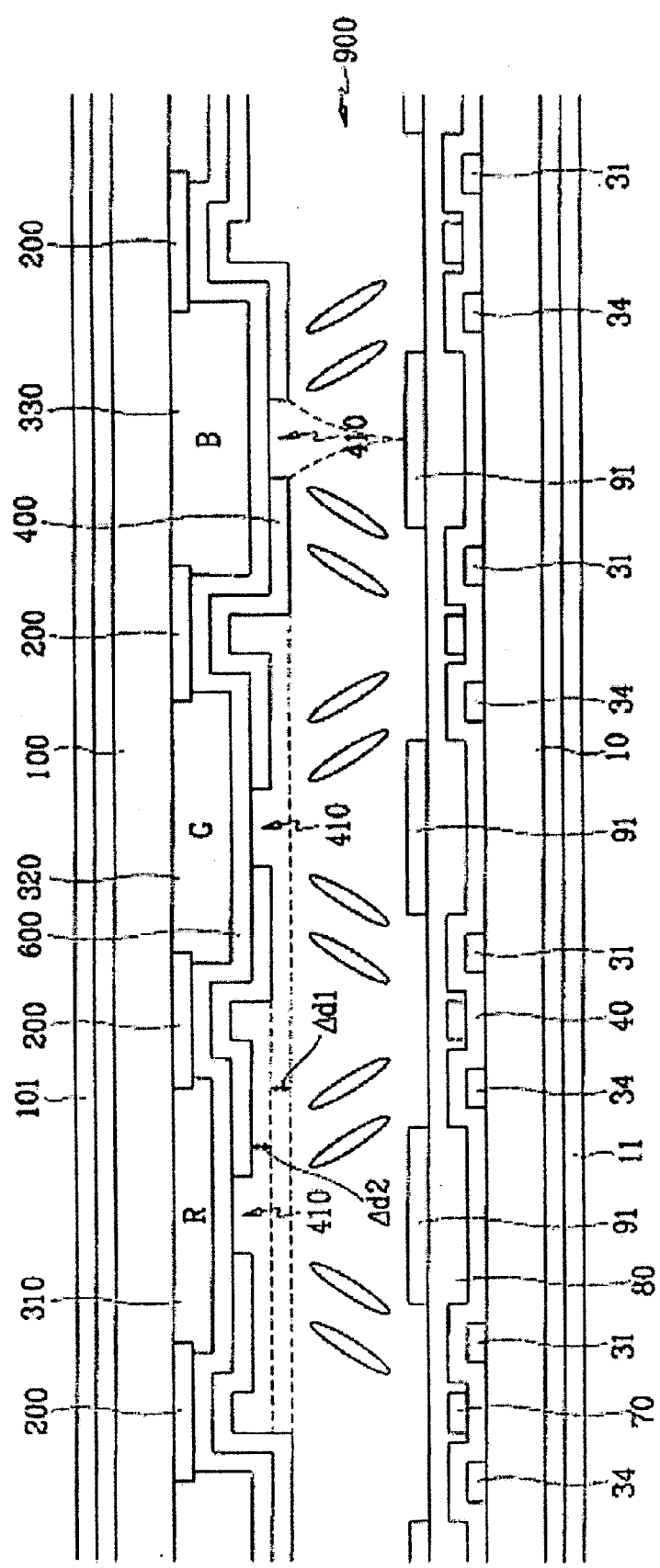

COLOR FILTER FOR A LIQUID CRYSTAL DISPLAY AND A LIQUID CRYSTAL DISPLAY USING THE SAME

BACKGROUND OF THE INVENTION (a) Field of the Invention

The present invention relates to a color filter for a liquid crystal display, and more particularly to a color filter for a liquid crystal display capable of offering a wide view angle by dividing a pixel area into a number of smaller domains.

(b) Description of the Related Art

Generally, a liquid crystal display is a device in which liquid crystal material is injected between an upper substrate on which common electrodes and color filters, etc. are formed, and a lower substrate on which a thin film transistor and pixel electrodes, etc. are formed. Different electric potentials are applied to the pixel electrodes and the common electrodes to form an electric field to change arrangement of liquid crystal molecules, thereby controlling transmissivity of light to embody images.

The biggest problem of a liquid crystal display is that it has a narrow view angle. There have been many approaches to enlarging the view angle. Among them, the method of aligning liquid crystal molecules perpendicularly to the upper and the lower substrates and forming an opening pattern or protrusions on the pixel electrodes or the common electrodes looks promising.

In such an opening-pattern forming method, an opening pattern is formed on each of the pixel electrodes and the common electrodes, and orientations of the liquid crystal molecules are arranged using the fringe field caused by the opening patterns to obtain a wide view angle. With this method, it is a key point to obtain uniform opening patterns.

In the opening pattern method of a transparent electrode such as ITO, IZO etc., a transparent overcoating film is formed on a colored film and the transparent electrode is vacuum-deposited on it. Adhesion of the transparent electrode to the overcoating film is a very important factor that determines the degree and quality of the opening pattern formation.

Currently, acrylic epoxy materials are typically used as the transparent overcoating film. However, acrylic epoxy materials have problems such as decreased heat resistance due to the transparent electrode annealing, poor adhesion to the Cr black matrix (BM), and poor light resistance due to UV cleaning which is performed to improve adhesion of the transparent electrode. Accordingly, there is a need for the development of a new material.

SUMMARY OF THE INVENTION

An object of the present invention is to provide a color filter for a liquid crystal display having a transparent overcoating film with a wide a transparent electrode such as ITO, IZO etc. pattern formation margin, and good heat resistance, light resistance, and transmissivity.

It is another object of the present invention to provide a color filter for a liquid crystal display that can offer a wide view angle to a liquid crystal display, preferably a transparent electrode PVA mode liquid crystal display.

It is another object of the present invention to provide a liquid crystal display, preferably a transparent electrode PVA mode liquid crystal display that contains such a color filter.

In order to achieve these objects, the present invention provides a color filter for a liquid crystal display comprising a pixel area, a black matrix, and a transparent overcoating film, wherein the transparent overcoating film comprises a thermosetting polymer obtained by mixing:

a) polyamic acid having siloxane terminal groups; and b) an epoxy compound having 1 to 4 epoxy groups.

Preferably, the polyamic acid of a) and the epoxy compound of b) are mixed in the weight ratio ranging from about 3:1 to about 3:2.

The present invention also provides a liquid crystal display that contains such a color filter. In one preferred embodiment, this liquid crystal display is a PVA liquid crystal display comprising:

a first insulating substrate;

first wiring formed on the first insulating substrate;

second wiring also formed on the first insulating substrate and intersecting the first wiring;

pixel electrodes formed on each pixel area defined by the intersection of the first wiring and the second wiring and having a first opening pattern; and a thin film transistor connected to the first wiring, the second wiring, and the pixel, electrodes.

Preferably, the PVA liquid crystal display also comprises:

a second insulating substrate opposing the first insulating substrate;

red, green, and blue (R, G, B) color filters formed on the second insulating substrate;

common electrodes formed on the second insulating substrate and having a second opening pattern; and a liquid crystal layer between the first insulating substrate and the second insulating substrate, wherein liquid crystal molecules are arranged perpendicularly to the first and the second substrates when no electric field is applied between the pixel electrodes and the common electrodes.

Preferably, the liquid crystal display also comprises pattern-formed a transparent electrodes. The transparent electrodes is preferably ITO (indium tin oxide), IZO (indium zinc oxide) electrodes etc. Also, the liquid crystal display preferably has different thicknesses by color where the red, green, and blue (R, G, B) color filters are located.

BRIEF DESCRIPTION OF THE DRAWINGS

FIG. 1B is a cross-sectional view along the line in A–A' of FIG. 1a.

FIG. 5 is a cross-sectional view along the line in IV–IV' of FIG. 4.

DETAILED DESCRIPTION OF THE PREFERRED EMBODIMENTS

The present inventors have worked to develop an overcoater that can improve adhesion of a transparent film such as ITO, or IZO etc. and the transparent overcoating film to extend the transparent film's opening pattern margin, and which has good heat resistance, light resistance, and transmissivity sufficient for a color filter manufacturing process. As a result, they have realized that a transparent overcoating film formed by a thermosetting mixture of polyamic acid and an epoxy compound in an adequate ratio has a wide the transparent electrode opening pattern margin, and good heat resistance, light resistance, and transmissivity, and that it can be used to obtain a good color filter.

Figure 1A:
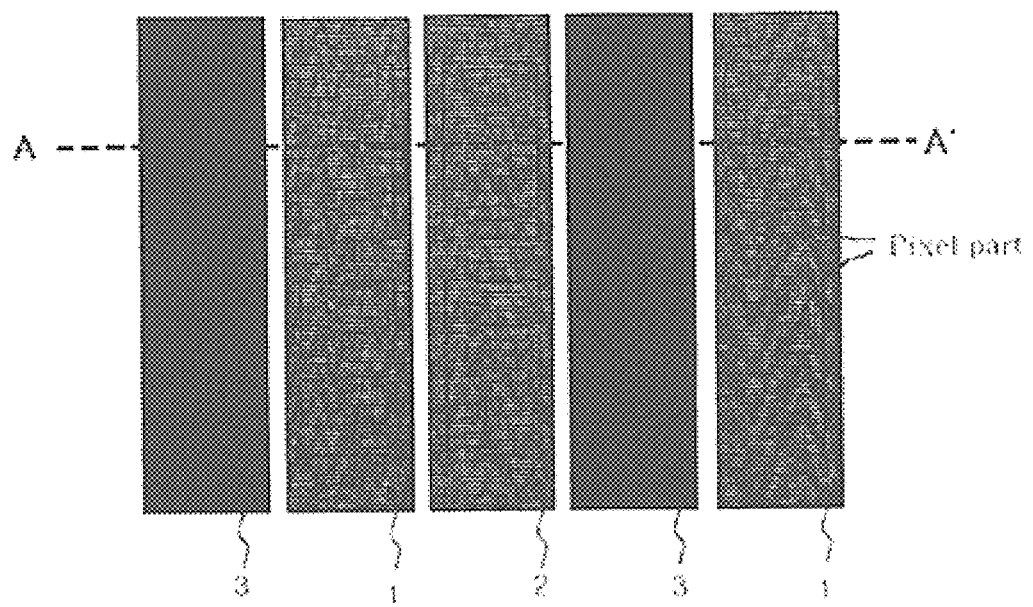
FIG. 1A is a cross-sectional view of a color filter according to one embodiment of the present invention, which comprises a transparent overcoating film on one side of the transparent glass substrate.
Figure 1B:
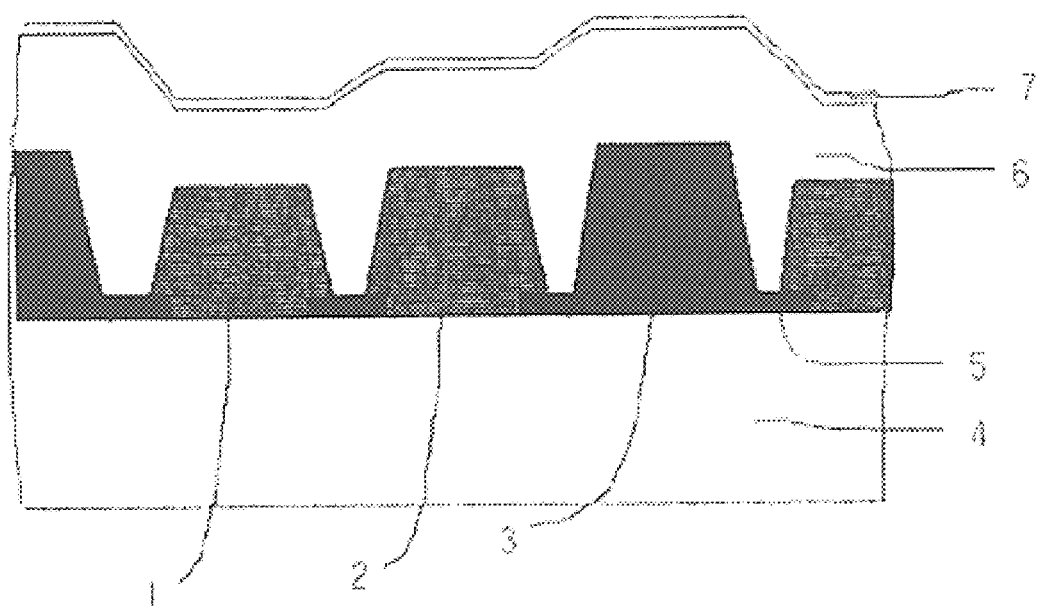

As seen in FIGS. 1A and 1B, the color filter of the present invention comprises a color pixel area consisting of a red pixel area 1, a green pixel area 2, and a blue pixel area 3; a colored film comprising a transparent glass substrate 4; a black matrix 5; a transparent overcoating film 6; and a transparent electrode 7. The transparent electrode 7 is preferably ITO (indium tin oxide), or IZO (indium zinc oxide) etc.

The transparent overcoating film is formed over the entire transparent glass substrate, which is a colored film. The transparent overcoating film comprises a thermosetting film which is a mixture of polyamic acid having a siloxane terminal group and an epoxy compound.

The polyamic acid offers adhesion to the transparent film. Although any imidizable polyamic acid can be used, the polyamic acid is preferably a compound represented by Chemical Formula 1. The terminal group of the polyamic acid, which has the siloxane structure of trialkoxysilane, is crosslinked during the baking process, and thereby improves heat resistance and light resistance of the overcoater film and increases adhesion to the transparent film.

The polyamic acid and the epoxy compound are preferably mixed in the weight ratio ranging from about 3:1 to about 3:2. However, the mixing ratio is not limited as long as the effect of the present invention is exhibited. Thermosetting of the polyamic acid and the epoxy compound occurs during the baking process, which proceeds under the common transparent overcoating film formation conditions.

Also, the transparent overcoating film of the present invention may include an acid anhydride. The acid anhydride participates in the thermosetting reaction of the epoxy compound. For example, phthalic acid anhydride or pyromellitic dianhydride represented by Chemical Formula 3 can be used for the acid anhydride. However, the structure and constituents of the acid anhydride are not particularly limited.

Chemical Formula 3

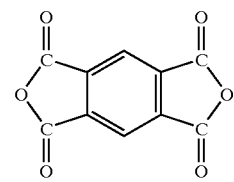

The transparent overcoater of the present invention may be one-part or two-part, and any uniformly miscible overcoater can be used if mixing is required. Also, a small amount of additives such as a surfactant, a leveling agent, or a coupling agent may be added to the transparent overcoater to improve wettability, leveling properties, or spreadability. Any solvent may be used, but it is preferable to use solvents with different boiling points to prevent stains due to evaporation of solvent during vacuum drying or baking.

Chemical Formula 1

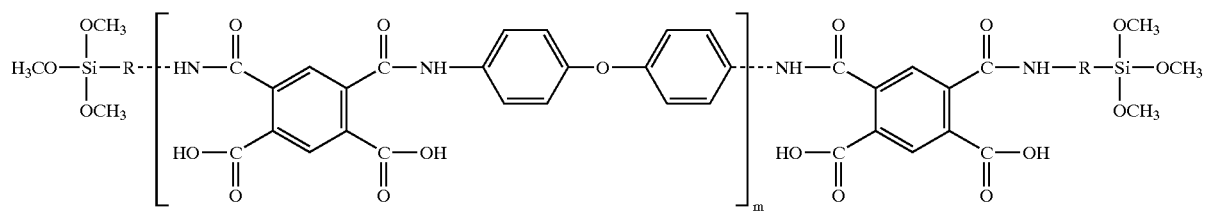

wherein R is a $C_{14}$ alkyl, and m is an integer of 10 to 500.

In addition, the epoxy compound offers flatness to the transparent overcoating film. Preferably, the epoxy compound is an epoxide having 1 to 4 epoxy groups. The molecular weight, structure, and constituents of the expoxy compound are not particularly limited. More preferably, the epoxy compound is a compound represented by Chemical Formula 2.

Chemical Formula 2

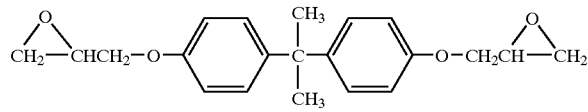

Thickness of the transparent overcoating film of the present invention is not limited, but it is preferably 1.0 to 3.0 μm.

Also, any transparent glass can be used for the color filter, but it is preferable to use a low-alkaline or non-alkaline glass. One coated with silicon oxide to prevent elution of metal ions can also be used.

In the present invention, any black matrix (BM) can be used for the color filter. That is, a Cr BM wherein Cr and $Cr_2O_3$, or Cr, CrN, and $Cr_2O_3$ are sputtered on a transparent glass substrate and openings are prepared by the known photo-process, or another metal BM, can be used. Also, an organic (resin) BM, which is prepared by applying, exposing, developing, and baking a colored photosensitive resin composition, wherein black pigments like carbon black or $TiO_2$ are dispersed on a transparent glass substrate, can be used. The shape and size of the openings, reflectivity, optical density, transmissivity, color, and the entire panel resolution of the BM are not restricted.

In the present invention, the material that offers the pixel color is preferably the commonly used pigment-spray type colored photosensitive resin composition. Constituents of the composition, kind and concentration of the pigments, and viscosity and color characteristics of the composition are not restricted. Also, the method of preparing pixels using the colored photosensitive resin composition is not limited. That is, the colored photosensitive resin composition can be applied, exposed, developed, and baked on a BM glass according to the known pigment spray method to obtain a colored film. The thickness of the colored film is also not restricted.

The transparent film is obtained by vacuum deposition on the transparent overcoating film by any known method. Thickness of the transparent film is preferably 1000 to 2000 Å, which is suitable for the transparent film surface resistance and pattern formation that affect the light transmissivity and liquid crystal action. A silicon oxide film may be formed on the transparent overcoating film before vacuum deposition of transparent film, in order to improve adhesion to the transparent film.

Additionally, in the present invention, opening pattern formation method, shape, density, and position of the pattern of the transparent film are not restricted. However, it is preferable to anneal the transparent film at a temperature of over 200° C. in the presence of oxygen prior to opening-pattern formation to grow transparent electrode crystals such as ITO, or IZO etc., thereby enhancing the film properties and improving the light transmissivity, and to apply the lithography process using a posi-type photoresist.

Also, in the present invention, for cleaning of the transparent overcoating film prior to lamination and transparent electrode vacuum deposition, it is preferable to use a wet cleaning method; a dry cleaning method using UV, plasma, or ultrasonic waves; or a combination thereof.

In the present invention, a protrusion layer (column spacer or photo spacer) may be formed instead of a bead-type spacer, which is inserted prior to assembly of the upper and lower substrates in order to maintain the panel's cell gap. This protrusion layer is preferably formed by making a positive- or negative-type photoresist in protrusion form on the BM and baking the same to make a spacer. The protrusion layer can be formed on the transparent overcoating film or beneath the transparent film. When it is formed beneath the transparent film, the transparent film should be removed during transparent electrode opening-pattern formation.

In the present invention, the height of each colored film of the BM openings is not restricted. However, when the blue pixel area is higher than the green pixel area, and the green pixel area is higher than the red pixel area, it is advantageous for obtaining a wide view angle of the final panel. Accordingly, in the PVA liquid crystal display of the present invention, the thickness of the liquid crystal is different depending on its color.

Now, a PVA liquid crystal display according to a preferred example of the present invention will be explained in detail referring to FIGS. 1–5.

Figure 2:
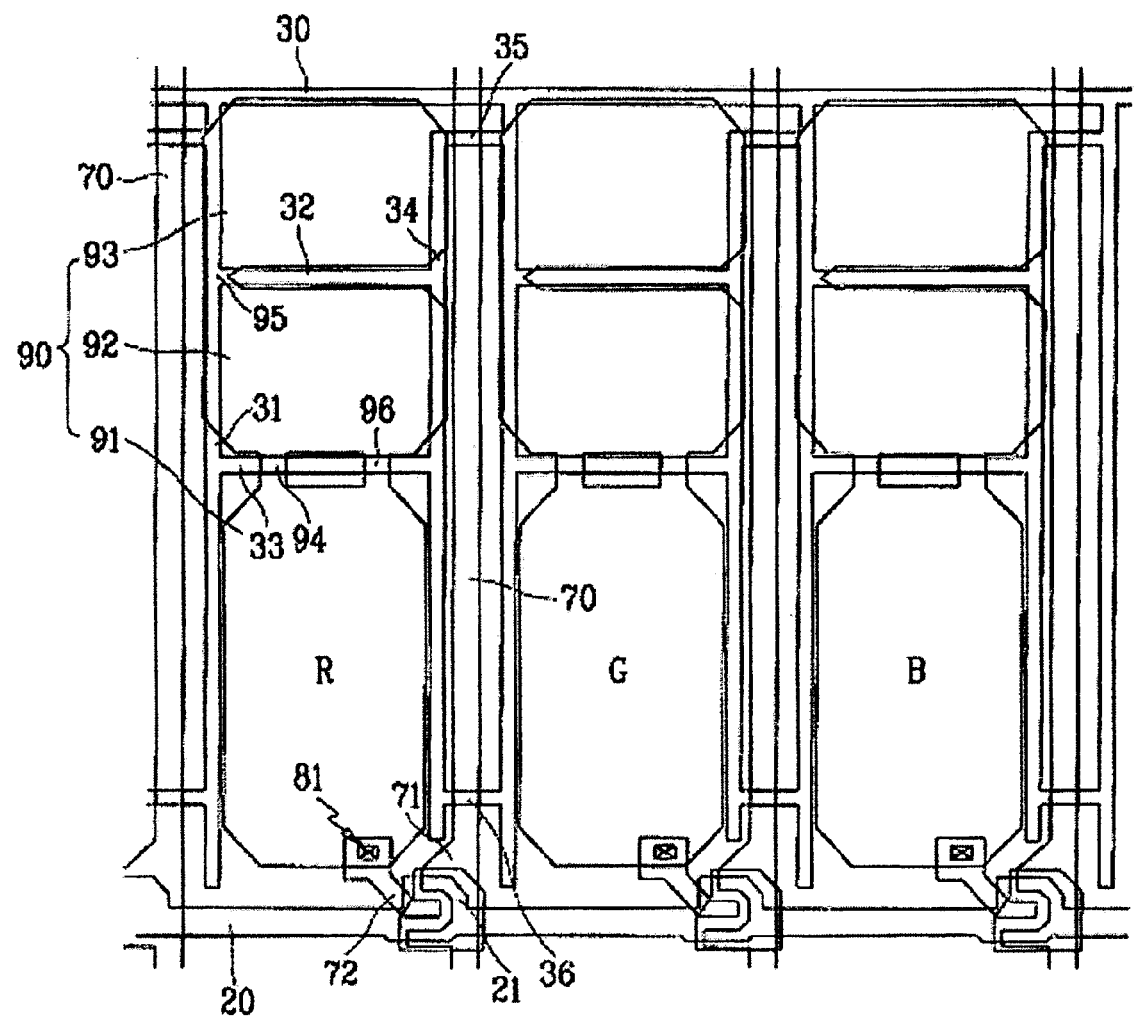
FIG. 2 is a diagrammatic view of a thin film transistor substrate of the liquid crystal display according to one embodiment of the present invention.
Figure 3:
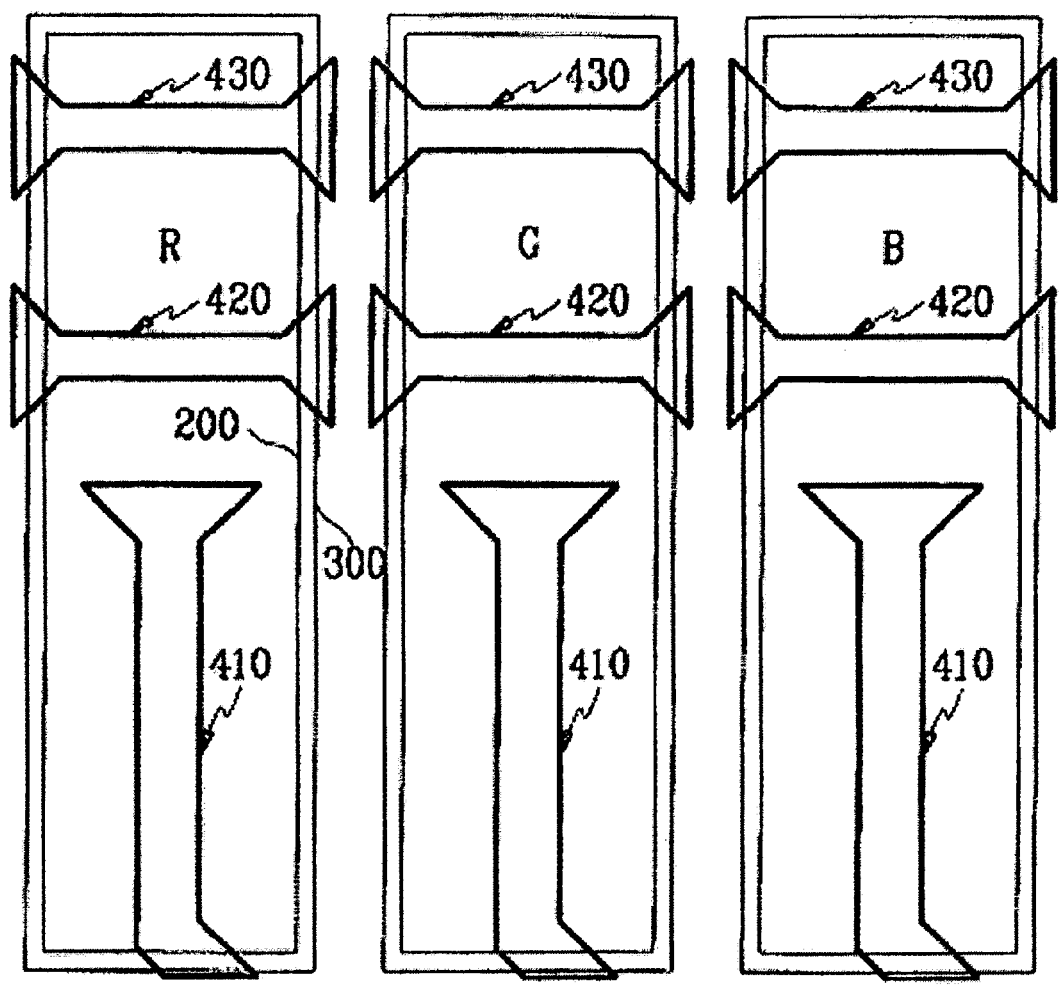
FIG. 3 is a diagrammatic view of openings formed on the common electrodes of the liquid crystal display according to one embodiment of the present invention.
Figure 4:
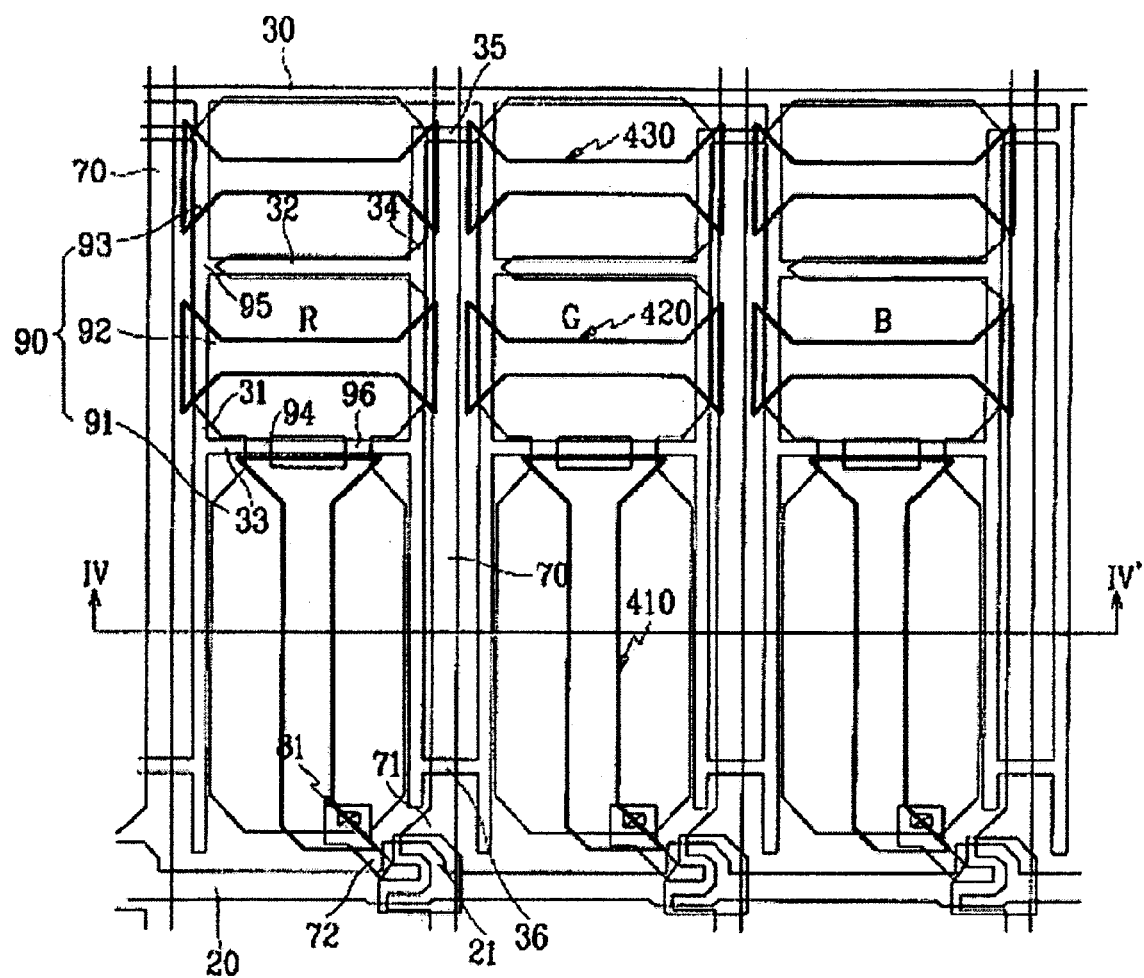
FIG. 4 is a diagrammatic view of openings on the pixel electrodes and the common electrodes of the liquid crystal display according to one embodiment of the present invention.

FIG. 2 is a diagrammatic view of a thin film transistor substrate of the liquid crystal display according to a preferred embodiment of the present invention; FIG. 3 is a diagrammatic view of openings formed on the common electrodes of the liquid crystal display according to a preferred embodiment of the present invention; FIG. 4 is a diagrammatic view of openings on the pixel electrodes and the common electrodes of the liquid crystal display according to a preferred embodiment of the present invention. FIG. 5 is a cross-sectional view along the line IV–IV' in FIG. 4.

Referring to FIG. 2 and FIG. 5, a thin film transistor substrate of a liquid crystal display according to a preferred example of the present invention will be explained.

On a transparent insulating substrate 10 such as glass, etc., there is a gate line 20 stretching horizontally, and a maintenance capacitor line 30 parallel to the gate line. On the gate line 20, protruding gate electrodes 21 are formed, and on the maintenance capacitor line 30, the first to fourth maintenance electrodes 31, 32, 33, 34 and maintenance electrode connectors 35, 36 are linked in a branch form.

The first maintenance electrode 31 is directly connected to the maintenance capacitor line 30 and stretch vertically. The second maintenance electrode 32 and the third maintenance electrode 33 are connected to the first maintenance electrode 31 and stretch horizontally. The fourth maintenance electrode 34 is connected to the second and the third maintenance electrodes 32, 33, and stretch vertically. The maintenance electrode connectors 35, 36 connect the fourth maintenance electrode 34 to a neighboring pixel's first maintenance electrode 31.

On the gate wiring 20, 21 and the maintenance capacitor wiring 30, 31, 32, 33, 34, 35, 36, there is a gate insulating film 40. And, on the gate electrode 21 on top of the gate insulating film 40, there is a semiconductor layer comprising amorphous silicon. On the semiconductor layer there are contact layers which comprise amorphous silicon wherein N-type impurities such as phosphorus, etc. are doped in a high concentration. On the contact layers, there are source electrodes 71 and drain electrodes 72. The source electrodes 71 are connected to data lines 70 which stretch vertically on the gate insulating film 40. On the data wiring 70, 71, 72, there is a protection film 80 having a contact opening 81 which exposes the drain electrode 72. On the protection film 80, there are pixel electrodes 90 which are connected to the drain electrodes 72 through the contact opening 81. The pixel electrodes 90 are composed of transparent conductive material, such as ITO (indium tin oxide), IZO (indium zinc oxide), etc.

The pixel electrodes 90 are divided into a first division 91, a second division 92 and a third division 93. These divisions are connected to each other through connectors 94, 95, and 96. The first division 91 is located in the lower half of the pixel area defined by intersection of the two gate lines 20 and two data lines 70, and has the shape of a rectangle whose four corners are cut off. The first division 91 is directly connected to the drain electrode 72 through the contact opening 81. The second division 92 and the third division 93 are located in the upper half of the pixel area, and also have the shape of rectangles whose four corners are cut off. The second division 92 is connected to the first division 91 through a first connector 94 and a second connector 96. The third division 93 is connected to the second division 92 through the third connector 95. The second maintenance electrode 33 is located between the first division 91 and the second division 92. The third maintenance electrode 32 is located between the second division 92 and the third division 93. The first maintenance electrode 31 and the fourth maintenance electrode 34 are located between the pixel electrode 90 and the data line 70.

In the first division 91, the side parallel to the data line is longer than the side parallel to the gate line. In the second and third divisions, the sides parallel to the data line are shorter than the sides parallel to the gate line. The second division 92 and the third division 93 overlap the first maintenance electrode 31 and the fourth maintenance electrode 34, but the first division 91 does not overlap them. Additionally, the maintenance capacitor line 30 is located between the gate line 20 and the third division 93. Usually, the electric potential applied to the common electrodes of the color filter substrate, which will be explained below, is applied to the maintenance capacitor line 30, the maintenance electrodes 31, 32, 33, 34, and the maintenance electrode connectors 35, 36.

As explained above, if a maintenance capacitor line or maintenance electrode to which a common electric potential is applied is put between the data line and pixel electrode and between the gate line and pixel electrode, the maintenance capacitor line or maintenance electrode blocks the effect of the data line and the gate line on the electric field of the pixel area, thereby offering a stable domain.

Now, a color filter substrate of the liquid crystal display according to a preferred example of the present invention will be explained referring to FIG. 3 and FIG. 5.

A black matrix 200 consisting of a Cr/Cr$_2$O$_3$ double layer formed on a transparent substrate 100 such as glass, etc., defines a pixel area. On each pixel area 300, red (R), green (G), and blue (B) color filters 310, 320, 330 are formed as explained above. The R, G, and B color filters 310, 320, 330 have different thicknesses, wherein the R filter 310 is thinnest and the B filter 330 is thickest. The difference in thickness is to make the liquid crystal cell gap different for each pixel area. An overcoating film 600 covers and protects the color filters 310, 320, 330, and there is a common electrode 400 consisting of a transparent conducting material on the overcoating film 600. An opening pattern is formed on the common electrode 400, and it comprises the first to the third openings 410, 420, 430. The first opening 410 bisects the lower half of the pixel area into left and right halves, while the second opening 420 and the third opening 430 divide the upper half of the pixel area in three lateral areas. Both ends of each opening 410, 420, 430 widen to the form of an isosceles triangle, and each opening 410, 420, 430 is separated from the others.

Now, a liquid crystal display according to a preferred example of the present invention will be explained referring to FIG. 4 and FIG. 5.

The thin film transistor substrate of FIG. 2 and the color filter substrate of FIG. 3 are aligned and assembled, and liquid crystal material 900 is injected between the two substrates, so that liquid crystal molecules included therein are aligned vertically. Then, two polarizing plates 11, 101 are positioned at right angles outside of the two substrates 10, 100.

When the two substrates 10, 100 are aligned, each division 91, 92, 93 of the pixel electrodes 90 of the thin film transistor substrate and the first to third openings 410, 420, 430 formed on the common electrode 400 of the color filter substrate overlap to divide the pixel area into many smaller domains. Each division 91, 92, 93 of the pixel electrode 90 has two long sides and two short sides. The long sides of each division are parallel to the data line 70 or the gate line 20, and form a 45° angle with the axes of the two polarizing plates. If the long sides of each division 91, 92, 93 of the pixel electrode 90 are adjacent to the data line 70 or the gate line 20, a maintenance capacitor line 30 or maintenance electrodes 31, 32, 33, 34 are positioned therebetween. Preferably, no maintenance capacitor wiring 30, 31, 32, 33, 34 is positioned around the short sides of each division 91, 92, 93 of the pixel electrode, but if it is, it is preferable to be entirely covered by the pixel electrode 90 or separated from the pixel electrode 90 by more than 3 $\mu$m. The reason for this is that in the part where the data line 70 or the gate line 20 is adjacent to the long sides of the divisions 91, 92, 93 of the pixel electrode, electric potential of the data line 70 or the gate line 20 hinders domain formation; and in the part where the data line 70 or the gate line 20 is adjacent to the short sides, electric potential of the data line 70 or the gate line 20 helps domain formation.

The liquid crystal material 900 is injected between the common electrode 400 and the pixel electrode division 91. As explained above, since the thicknesses of the R, G, and B color filters 310, 320, 330 are different, spacing between the common electrode 400 and the pixel electrode 90 is also different for the R, G, and B pixel areas. That is, the cell gaps of the R, G, and B pixel areas are different from one another. The cell gap of the R pixel area (R cell gap) is the largest, and that of the B pixel area (B cell gap) is the smallest. These different R, G, and B cell gaps reduce color shift according to gradation.

Hereinafter, the present invention is described in more detail through EXAMPLES and COMPARATIVE EXAMPLES. However, the following EXAMPLES are only for the understanding of the present invention, and the present invention is not limited to the following EXAMPLES.

EXAMPLES

Example 1

Preparation of a Color Filter

A transparent glass substrate of 730 mm×920 mm×0.7 mm (Corning's 1737) was cleaned and dried using a UV cleaner equipped with a low pressure mercury lamp. A Cr film with a thickness of 1600 Å and a Cr$_2$O$_3$ film with a thickness of 400 Å were continuously sputtered to obtain a Cr glass.

A posi-photoresist (Clariant's HKT601) was applied at a thickness of 1.2 $\mu$m on the Cr glass. After drying, it was exposed at 50 mJ/cm$^2$ using a mask having an opening of 230 $\mu$m×60 $\mu$m. The exposed glass was developed with alkali. Then, the opening where the posi-photoresist had been developed was etched with CAN (cerium ammonium nitrate), and the posi-photoresist was peeled off and cleaned to obtain a black matrix glass.

A red photoresist (Dongwoo Fine-Chem's M-R352) was applied on the prepared black matrix glass, and it was exposed, developed, and baked to obtain a red pixel. With the same method, a green pixel was obtained from a green photoresist (Dongwoo Fine-Chem's M-G302S), and a blue pixel from a blue photoresist (Dongwoo Fine-Chem's M-B342).

The glass with the colored film formed thereon was cleaned with a low pressure mercury lamp (effective wavelength: 254 nm) UV cleaner (Clean Tech's CT-2000 PPM) to remove residues and impurities. Then, a transparent overcoater was applied on the entire surface of the glass, so that the final film thickness after baking became 1.5 μm, and the glass was baked at 230° C. for 40 minutes. Here, polyamic acid represented by Chemical Formula 1a and an epoxy compound represented by Chemical Formula 2 were mixed in the weight ratio of 3:1 to obtain the transparent overcoating film.

Chemical Formula 1a

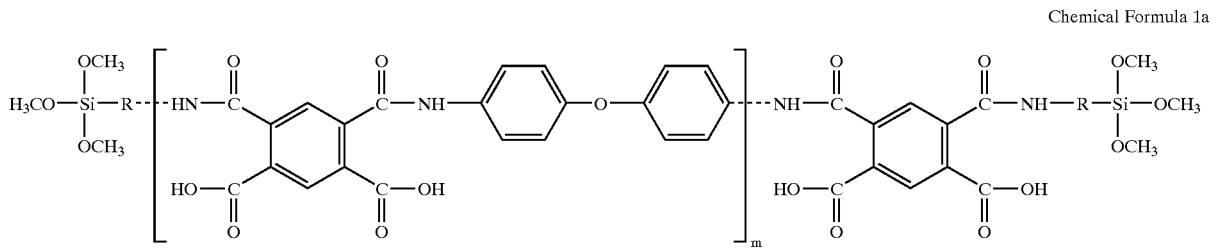

wherein R is a methyl and m is 50.

Chemical Formula 2

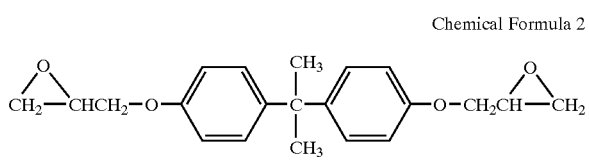

ITO film was vacuum-deposited at a thickness of 1300 Å at 100° C. on the entire surface of the glass with a sputterer (Woolbaksa). Then, it was annealed at 240° C. for 90 min to form ITO crystals, an ITO pattern was formed by a photoprocess, and the ITO film was etched with aqua regia.

A protrusion (column spacer) formation material (JSR's NN-777) was applied on the pattern-formed glass. It was then exposed, developed, and baked to form a 3.5 μm-thick protrusion film on the black matrix. As a result, a color filter for a PVA liquid crystal display was obtained.

Comparative Examples 1 to 3

Comparative Examples 1 to 3 were produced by the same method as in Example 1, except that two-part epoxy acrylate (JSR), one-part epoxy acrylate (Dongjin Semichem), and photocuring acrylate (JSR) were used for the transparent overcoating film, respectively.

Experimental Example

For the color filters prepared by Example 1 and Comparative Examples 1 to 3, the following physical properties were tested. The results are shown in Table 1.

1. Transmissivity and Optical Characteristics:

For each color filter, the transmissivity (%) of the transparent part (overcoating film and ITO film) at the wavelength of 450 nm was measured with an OSP-SP200 (Olympus). Also, in the wavelength range of 400 to 700 nm (illuminant C), spectroscopic values of each of red, green, and blue were determined and converted into the CIE white coordinate system.

2. Heat Resistance:

To evaluate heat resistance of the overcoating film depending on annealing of the ITO film, a change in transmissivity of the color filter before and after annealing was determined (good=below 1%; moderate=1 to 3%; poor= over 3%). Also, the x, y change in the CIE white coordinate system was determined (good=below 0.002; moderate= 0.002 to 0.005; poor=over 0.005).

3. Light Resistance:

To evaluate light resistance of the transparent overcoating film depending on the UV treatment prior to vacuum deposition of the ITO film, the overcoated color filter was treated with a low pressure mercury lamp (254 nm; accumulated exposure amount=1000 mJ/cm$^2$) and a change in transmissivity was determined (good=below 1%; moderate=1 to 3%; poor=over 3%). Also, the x, y change in the CIE white coordinate system was determined (good=below 0.002; moderate=0.002 to 0.005; poor=over 0.005).

4. Adhesion to Cr Film:

To evaluate adhesion of the transparent overcoating film to the Cr film of the BM of the color filter, where a sealant is applied for assembly of the TFT glass and the color filter, a cross-cut tape peeling test was carried out according to the JIS K-5400 standard on the overcoater film of the Cr BM part of the overcoated color filter. Among 100 lattices, lattices remaining after tape peeling were determined.

5. ITO Pattern Formation Ability:

To evaluate an opening-pattern formation margin of the ITO film, opening patterns were repeatedly formed on a color filter wherein the ITO film annealing had been completed, using aqua regia at 45° C., with the etching time of 0 to 300% (25% interval) of the JET (just etching time). The undercut of the ITO film at the boundary of the transparent overcoating film and the ITO film was observed with a scanning electron microscope (SEM) to evaluate the etching margin ratio (%) up to the point of the undercut generation. Additionally, linewidth (CD) of the opening pattern was determined.

TABLE 1

| | Transparent overcoating film | Heat resistance | | Light resistance | | Adhesion to Cr film | ITO pattern formation ability | |
|---|---|---|---|---|---|---|---|---|
| | | Transmissivity (%) | Δx Δy | Transmissivity (%) | Δx Δy | No. of remaining lattices | CD (μm)† | Margin % |
| Example 1 | 3:1 mixture of polyamic acid epoxy compound | Good | Good | Good | Good | 100 | 10.3 | 250 |
| Comp. Example 1 | Two-part epoxy acrylate | Good | Moderate | Good | Moderate | 53 | 12.5 | 175 |
| Comp. Example 2 | One-part epoxy acrylate | Good | Good | Moderate | Moderate | 38 | 13.7 | 125 |
| Comp. Example 3 | Photocuring acrylate | Moderate | Poor | Moderate | Poor | 67 | 13.4 | 150 |

†CD (μm) size of the ITO opening pattern is 10 μm.

As shown in Table 1, the transparent overcoating film of the color filter according to the present invention (Example 1), comprising a thermosetting mixture of polyamic acid and epoxy compound, had superior heat resistance and light resistance to those of Comparative Examples 1 to 3. Moreover, the transparent overcoating film of Example 1 showed superior adhesion to the Cr film to those of Comparative Examples 1 to 3. Also, the transparent overcoating film of Example 1 showed a 75 to 100% higher margin ratio than those of Comparative Examples 1 to 3 even with a low opening linewidth, which demonstrates that it has a very good ITO pattern formation ability.

As explained in detail above, a color filter for a liquid crystal display of the present invention comprises a transparent overcoating film having a wide a pattern formation margin of a transparent electrode such as ITO (indium tin oxide), IZO (indium zinc oxide) and superior heat resistance, light resistance, and transmissivity. When applied to a liquid crystal display, this color filter can offer a liquid crystal display, particularly an PVA mode liquid crystal display with good physical properties and which is capable of realizing a wide view angle.

What is claimed is:

1. A color filter for a liquid crystal display comprising a pixel area, a black matrix, and a transparent overcoating film, wherein the transparent overcoating film comprises a thermosetting polymer comprising:
   polyamic acid having siloxane terminal groups; and
   an epoxy compound having 1 to 4 epoxy groups.

2. The color filter for a liquid crystal display according to claim 1, wherein the polyamic acid and the epoxy compound are mixed in a weight ratio ranging from about 3:1 to about 3:2.

3. The color filter for a liquid crystal display according to claim 1, wherein the polyamic acid is a compound having the structure:

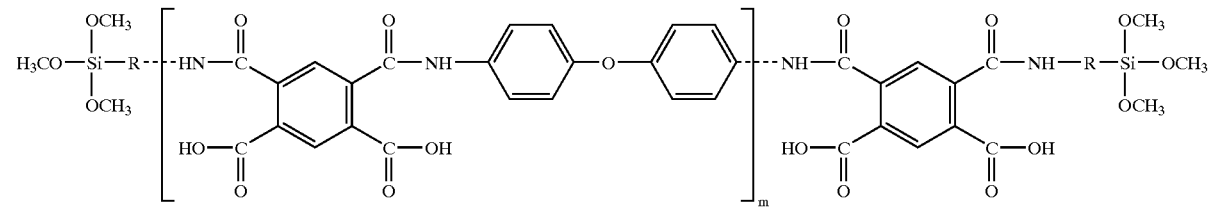

wherein r is a $C_1$–$C_4$ alkyl, and m is an integer of 10 to 500.

4. The color filter for a liquid crystal display according to claim 1, wherein the epoxy compound is a compound having the structure:

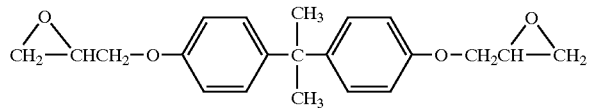

5. The color filter for a liquid crystal display according to claim 1, wherein the transparent overcoating film further comprises an acid anhydride.

6. A liquid crystal display, comprising the color filter according to claim 1.

7. The liquid crystal display according to claim 6, wherein the liquid crystal display is a PVA (patterned vertical alignment) liquid crystal display, comprising:

a first insulating substrate;

first wiring formed on the first insulating substrate;

second wiring also formed on the first insulating substrate and intersecting the first wiring;

pixel electrodes formed on each pixel area defined by the intersection of the first wiring and the second wiring and having a first opening pattern; and a thin film transistor connected to the first wiring, the second wiring, and the pixel electrodes.

8. The liquid crystal display according to claim 7, wherein the liquid crystal display is a PVA liquid crystal display, comprising:

a second insulating substrate opposing the first insulating substrate, wherein the color filter comprises red, green, and blue (R, G, B) color filters and is formed on the second insulating substrate;

common electrodes formed on the second insulating substrate and having a second opening pattern; and a liquid crystal layer between the first insulating substrate and the second insulating substrate, wherein liquid crystal molecules are arranged perpendicularly to the first and the second substrates when no electric field is applied between the pixel electrodes and the common electrodes.

9. The liquid crystal display according to claim 8, wherein each of R cell gap, G cell gap, and B cell gap is different from each other.

10. The liquid crystal display according to claim 6, wherein the liquid crystal display further comprises pattern-formed a transparent electrodes.

11. The liquid crystal display according to claim 10, wherein the transparent electrode is ITO (indium tin oxide) or IZO (indium zinc oxide) electrodes.

* * * * *

UNITED STATES PATENT AND TRADEMARK OFFICE
CERTIFICATE OF CORRECTION

PATENT NO. : 6,759,172 B2
DATED : July 6, 2004
INVENTOR(S) : Chul Huh et al.

It is certified that error appears in the above-identified patent and that said Letters Patent is hereby corrected as shown below:

Column 12,
Line 45, delete "r" and insert -- R --.

Signed and Sealed this

Seventh Day of December, 2004

JON W. DUDAS
*Director of the United States Patent and Trademark Office*